US012800656B2

(12) United States Patent
Chuang et al.

(10) Patent No.: US 12,800,656 B2
(45) Date of Patent: Nov. 17, 2026

(54) EFFICIENT AND HIGH COVERAGE TESTING APPROACH FOR MEMORY DEVICES

(71) Applicant: Taiwan Semiconductor Manufacturing Company, Ltd., Hsinchu (TW)

(72) Inventors: Chao-Kai Chuang, Hsinchu City (TW); Yu-Hao Hsu, Hsinchu City (TW); Hao-Wen Hsu, Hsinchu City (TW); Ming-Hung Chang, Hsinchu City (TW); Yen-Chien Lai, Hsinchu City (TW); Hung-Jen Liao, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 79 days.

(21) Appl. No.: 18/928,591

(22) Filed: Oct. 28, 2024

(65) Prior Publication Data

US 2026/0118424 A1 Apr. 30, 2026

(51) Int. Cl.
*G01R 31/3185* (2006.01)

(52) U.S. Cl.
CPC ............................ *G01R 31/318536* (2013.01)

(58) Field of Classification Search
None
See application file for complete search history.

(56) References Cited

U.S. PATENT DOCUMENTS

| | | | | | |
|---|---|---|---|---|---|
| 5,606,568 | A * | 2/1997 | Sudweeks | G01R 31/31908 | 714/729 |
| 7,487,419 | B2 * | 2/2009 | Mukherjee | G01R 31/318541 | 714/724 |
| 10,162,005 | B1 * | 12/2018 | Alzheimer | G01R 31/318547 | |
| 2002/0138801 | A1 * | 9/2002 | Wang | G01R 31/31705 | 714/729 |

(Continued)

FOREIGN PATENT DOCUMENTS

TW 200807427 A 2/2008

OTHER PUBLICATIONS

K. Poulos, J. Kuchi and T. Haniotakis, "An enhanced approach to reduce test application time through limited shift operations in scan chains," 2017 IEEE North Atlantic Test Workshop (NATW), Providence, RI, USA, 2017, pp. 1-4, (Year: 2017).*

(Continued)

*Primary Examiner* — Daniel F. McMahon
(74) *Attorney, Agent, or Firm* — Foley & Lardner LLP

(57) ABSTRACT

Memory systems, devices, and a method of operating the same are disclosed. In one aspect, a system includes a first memory device. The first memory device includes a first memory element, a first input port, and a first internal scan chain coupled between the first memory element and the first input port. The system includes a second memory device. The second memory device includes a second memory element, a second input port, and a second internal scan chain coupled between the second memory element and the second input port. The system includes a control circuit configured to propagate a first test vector through the first internal scan chain and a second test vector through the second internal scan chain.

20 Claims, 5 Drawing Sheets

(56) References Cited

U.S. PATENT DOCUMENTS

| | | | | |
|---|---|---|---|---|
| 2002/0194558 | A1* | 12/2002 | Wang | G06F 30/30 716/106 |
| 2003/0023941 | A1* | 1/2003 | Wang | G01R 31/318594 716/103 |
| 2003/0074614 | A1* | 4/2003 | Dorsey | G01R 31/318522 714/724 |
| 2004/0068684 | A1* | 4/2004 | Huang | G11C 29/56 714/718 |
| 2009/0177934 | A1* | 7/2009 | Irby | G11C 29/32 714/E11.155 |
| 2009/0265596 | A1* | 10/2009 | Chen | H10P 74/273 714/E11.155 |
| 2019/0120902 | A1 | 4/2019 | Alzheimer | |
| 2020/0355744 | A1* | 11/2020 | Narayanan | G01R 31/318552 |
| 2022/0300389 | A1* | 9/2022 | Pandey | G01R 31/3187 |
| 2022/0334181 | A1* | 10/2022 | Poudel | G11C 29/16 |
| 2022/0382485 | A1 | 12/2022 | Mondello et al. | |

OTHER PUBLICATIONS

Office Action issued in Taiwan Appl. No. 114109245 dated Nov. 21, 2025.

* cited by examiner

EFFICIENT AND HIGH COVERAGE TESTING APPROACH FOR MEMORY DEVICES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
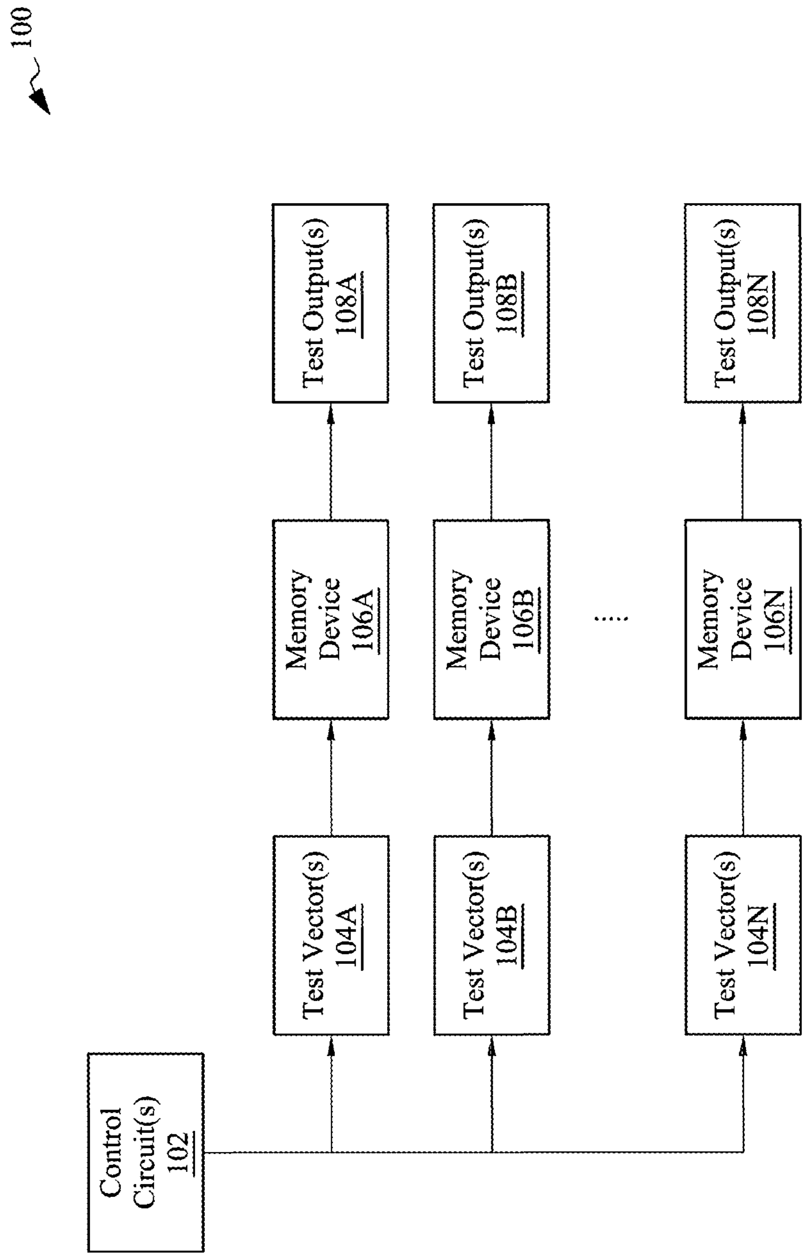
FIG. 1 illustrates a diagram of an example memory test system implementing memory device-specific testing, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory circuits, include static random-access memory (SRAM) circuits, often includes arrays of memory cells that are selectively controlled to perform read and write operations. Verification of memory circuits can be performed using scan chains. Scan chains are implemented in Design for Testability (DFT) approaches testing integrated circuits. Scan chain circuits can include interconnected flip-flops that allow for sequential testing of logic circuits, such as memory circuits, within a semiconductor device. Conventionally, scan chains have been utilized to test memory devices by configuring them into groups. Each group of memory devices is then configured into a single scan chain, and a single test pattern is applied through the shared scan chain to test all memory devices in the group.

Such approaches for testing memory devices can be used to test various characteristics of the group, including the minimum voltage (Vmin) of the memory devices. However, this grouping strategy presents several limitations. For example, as all memory devices in a group are tested using a single test vector, only the Vmin of the lowest-performing memory device will be identified, without identifying the specific memory device having the lowest-performing Vmin characteristic. This approach therefore often fails to accurately reflect the performance of all the SRAMs within a design. Furthermore, conventional DFT tests, implemented using Direct Memory Access (DMA) controllers, often evaluate only a partial subset of the overall functionality of associated hardware components. The limited testing of logical components realized by testing groups of memory devices simultaneously fail to verify the full functionality and timing of each memory device individually.

To overcome these shortcomings, the techniques described herein provide dedicated scan chains for each individual memory device in a semiconductor design. Each memory device can be equipped with both an internal scan chain and an interface scan chain, enabling targeted and precise characterization of its Vmin requirements, as well as its overall accuracy and timing. This individualized testing eliminates the reliance on group-based assessments and provides a more accurate representation of the performance characteristics of each memory device.

The internal scan chain provides testing coverage for characteristics inherent to the memory device and can be utilized to evaluate the performance of flip-flops coupled to the memory device. The internal scan chain can also be used to evaluate whether the memory device produces expected output signals in response to input test vectors. The interface scan chain can be used to evaluate characteristics associated with the input/output interface coupled to the memory device under test. These characteristics include, but are not limited to, setup and hold time parameters for the interface logic of the memory device.

Implementing scan chains that are specific to individual memory devices facilitates targeted testing operations that focus on evaluating specific characteristics of each individual memory device. In contrast to conventional approaches that evaluate characteristics common to groups of memory devices, targeted testing circuits described herein implement individual-device-specific scan chains that enable more precise and granular evaluation of the functionality and performance of each memory device within a memory system. As scan chains are implemented for each memory device, in some implementations, test control circuits can perform testing operations of multiple memory devices in parallel using device-specific testing vectors.

FIG. 1 illustrates a diagram of an example memory test system 100 implementing memory device-specific testing, in accordance with some embodiments. The memory test system 100 can be included in any type of integrated circuit (IC), semiconductor device, or memory system. In at least one embodiment, the memory devices 106A-106N can be included in an IC. In another embodiment, one or more of the memory devices 106A-106N may be included in separate ICs or memory systems.

Each of the components shown in the memory test system 100 may receive power from one or more voltage sources. The memory test system 100 may include one or more logic gates and sub-circuits, each of which may be constructed from one or more logic gates. Logic gates are electronic devices that perform logical operations on one or more input signals to produce a single output signal. Various embodiments of the circuits and logic gates that implement the memory test system 100 may include various transistors. The transistors described herein may have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

It should be understood that although the memory test system 100 shown in FIG. 1 can be a portion of a larger memory circuit, including any number or arrangement of memory devices 106A-106N, which may be accessed using corresponding internal scan chains and/or interface scan chains, as described in further detail herein. Likewise, although not shown here for visual clarity, various additional circuitry may be included to address (e.g., select) one or more of the memory devices 106A-106N to perform different memory operations, such as write operations, read operations, or testing operations, among others.

The memory test system 100 is shown as including one or more control circuits 102 that provide a set of test vectors 104A-104N (sometimes generally referred to as "test vector(s) 104") that can be used to perform various testing operations. The memory test system 100 is shown as including a set of memory devices 106A-106N (sometimes generally referred to as "memory device(s) 106"), which can include various logic circuitry that receives a corresponding test vector 104 and performs test operations to measure characteristics of the memory device 106. Further details of the scan changes that may be implemented by the set of memory devices 106 are described in connection with FIGS. 2, 3, and 4.

Each memory device 106 can be any type of memory device capable of storing at least one bit of memory data, including but not limited to an SRAM cell, a set of SRAM cells (e.g., a column, row, or bank of SRAM cells), a dynamic random access memory (DRAM) cell, or a set of DRAM cells (e.g., a column, row, or bank of DRAM cells), among others. In contrast to conventional approaches in which multiple memory devices share a single scan chain for DFT and/or built-in self-test (BIST) operations, the memory devices 106 of the memory test system 100 are each shown as receiving a respective test vector 104. Each memory device 106 can include logic gates, transistors, or other circuit elements that can control the operation of the memory device to perform read, write, or testing operations. In some implementations, each memory device 106 can include one or more input flip-flops and/or output flip-flops that store signals that are to be propagated through one or more memory cells of the memory device 106.

In this example, each memory device 106 is shown as receiving a respective test vector 104. Each test vector 104 can include a set of sequences of signals that are to control various circuitry of the corresponding memory device 106 to perform testing operations. The test vectors 104 can be or include BIST vectors, in some implementations. The test vectors 104 can be provided to operate as input stimuli for the memory device 106 under test, eliciting specific output responses that are then compared against expected values. The test vectors 104 can be pre-determined vectors tailored to various aspects of the memory device 106 to test its functionality and timing, and may be generated based on memory architecture, operating conditions, and desired testing objectives.

In one example, the test vectors 104 can be used to evaluate the Vmin requirement of a memory device. In such an example, the test vectors 104 may include signals that progressively decrease the supply voltage while applying predefined data patterns to the memory device 106 under test. The output data extracted from the memory device 106 is then analyzed to identify any errors or inconsistencies that indicate a degradation in performance below the Vmin threshold. To evaluate timing characteristics such as setup and hold times, test vectors 104 may include or provide rapid transitions of input signals, with precise timing control applied to measure the ability of the memory device 106 to reliably capture and maintain data during such transient states. In some implementations, the test vectors 104 can be generated to simulate potential faults or anomalies within the memory device 106, such that the response of the memory device 106 to determine the fault tolerance or robustness of the memory device 106 under test.

The memory test system 100 is shown as including a set of test outputs 108A-108N (sometimes generally referred to as "test output(s) 108"). The test outputs 108 can include any data generated or otherwise produced by the memory device in response to application of a corresponding test vector 104. In some implementations, the test vectors 104 can include data that is to be written to a memory device 106, and the test outputs 108 can include that data read from the memory device 106. In some implementations, a respective set of test outputs 108 can itself a vector that corresponds to each entry in a corresponding test vector 104. For example, if a test vector 104 includes a sequence of data that is to be written to a memory device 106, the test outputs 108 can include a corresponding sequence of data that is read from the memory device 106.

The format of the test outputs 108 can depend on the type of memory device 106 and the testing process performed (e.g., the test vector(s) 104 provided) that resulted in generation of the test outputs 108. In some implementations, the test outputs 108 can include one or more of a representation of data stored in a corresponding memory device 106, one or more error flags indicating any detected faults in the memory device 106, or status bits reflecting an operational state of the memory device 106, among other data that may be generated by the memory device 106 (or logic circuits thereof).

The memory test system 100 is shown as including one or more control circuits 102. A control circuit 102 can include a circuit, software, hardware, or combinations thereof, that can provide one or more test vectors 104 to test one or more memory devices 106. In some implementations, the control circuit 102 can be a built-in self-test (BIST) control circuit 102 that is present on the same integrated circuit as each of the one or more memory devices 106. In some implementations, the control circuit 102 be present on a separate integrated circuit that is coupled to/in communication with an integrated circuit that includes one or more of the memory devices 106. In some implementations, the control circuit may be in communication with multiple integrated circuits, each including one or more memory devices 106.

The control circuit 102 retrieve and/or generate test vectors 104. In some implementations, the control circuit 102 can access Waveform Generation Language (WGL) data to generate one or more test vectors 104 for one or more memory devices 106. The control circuit 102 can access and/or generate one or more test vectors 104 in response to one or more signals/requests to initiate a testing process for one or more of the memory devices 106A-106N. The signals/requests can indicate which of the memory devices 106 are to be tested, the test vector(s) 104 to access/generate/provide to the specified memory device(s) 106, as well as the characteristics of the specified memory device(s) 106 to measure/monitor in the generated test outputs 108.

The control circuit 102 can provide a test vector 104 to a memory device 106 by shifting the signals of the test vector through each of the registers of one or more scan chains of the memory device 106. As described in further detail in connection with FIGS. 2, 3, and 4, each memory device 106 can include an internal scan and an interface scan chain. Depending on the type of testing operation being performed, the control circuit 102 can provide the test vector 104 to the internal scan chain, the interface scan chain, or both. Providing a test vector 104 to the scan chain(s) of a memory device 106 can include shifting the test vector through each of the registers in the scan chain. The control circuit 102 may provide additional signals to control the clock, supply voltage, and/or other states of the memory device(s) 106 under test.

In some implementations, prior to providing a test vector 104 through the scan chain(s) of a memory device 106, the control circuit 102 can provide various configuration signals to enable a testing mode of the memory device. This can include, in one example, providing a scan enable signal to configure one or more flip-flops of the memory device 106 into one or more scan chains. In some implementations, the control circuit 102 can provide a scan clock signal, which can synchronize input of the test vector(s) 104 to the scan chain of the memory device 106.

The control circuit 102 can execute testing operations (e.g., by setting corresponding control signals, providing test vectors 104, etc.) to memory devices 106 individually or in parallel. In some implementations, the control circuit 102 can provide a different test vector 104 to each of the memory devices 106 under test. In some implementations, the control circuit 102 can provide the same test vector 104 to each of the memory devices 106 under test. The control circuit 102 can coordinate testing of setup and hold times, Vmin, or other characteristics of the memory device(s) 106.

The control circuit 102 can receive/access the test outputs 108 generated by the memory device(s) 106 under test to evaluate different characteristics of the devices under test. In some implementations, the control circuit 102 can provide one or more test vectors 104 to test functionality and timing of various components of the memory device 106. For example, characteristics such as the functionality (e.g., whether the components are operating under normal conditions), Vmin, setup, and/or hold times of the input flip-flops of the memory device 106 can be tested by comparing the test outputs 108 with expected outputs associated with the test vector 104. If the expected outputs do not match the test outputs 108 under certain operating conditions, the control circuit 102 can determine that the memory device 106 is not operating properly under those conditions. For example, the supply voltage at which the memory device 106 no longer operates correctly can be identified as the Vmin threshold for the memory device 106. Similar approaches can be used to determine the setup/hold times under which the memory device 106 can operate.

By implementing device-specific scan chains for each memory device 106, the control circuit 102 can monitor and determine characteristics of each of the memory devices 106 individually. This provides improved test coverage relative to conventional group-based approaches. These approaches can be used to determine Vmin efficiently and accurately for each of the memory devices 106 of a memory system, as well as specific setup/hold violations for certain memory devices, flip-flop/scan chains, or other components of the memory device 106. The memory test system 100 also enables logic to isolate and test a single memory device 106, while deactivating testing logic for other memory devices 106 in the system. Examples of the scan chains that may be implemented according to the techniques described herein are described in connection with FIGS. 2, 3, and 4.

Figure 2:
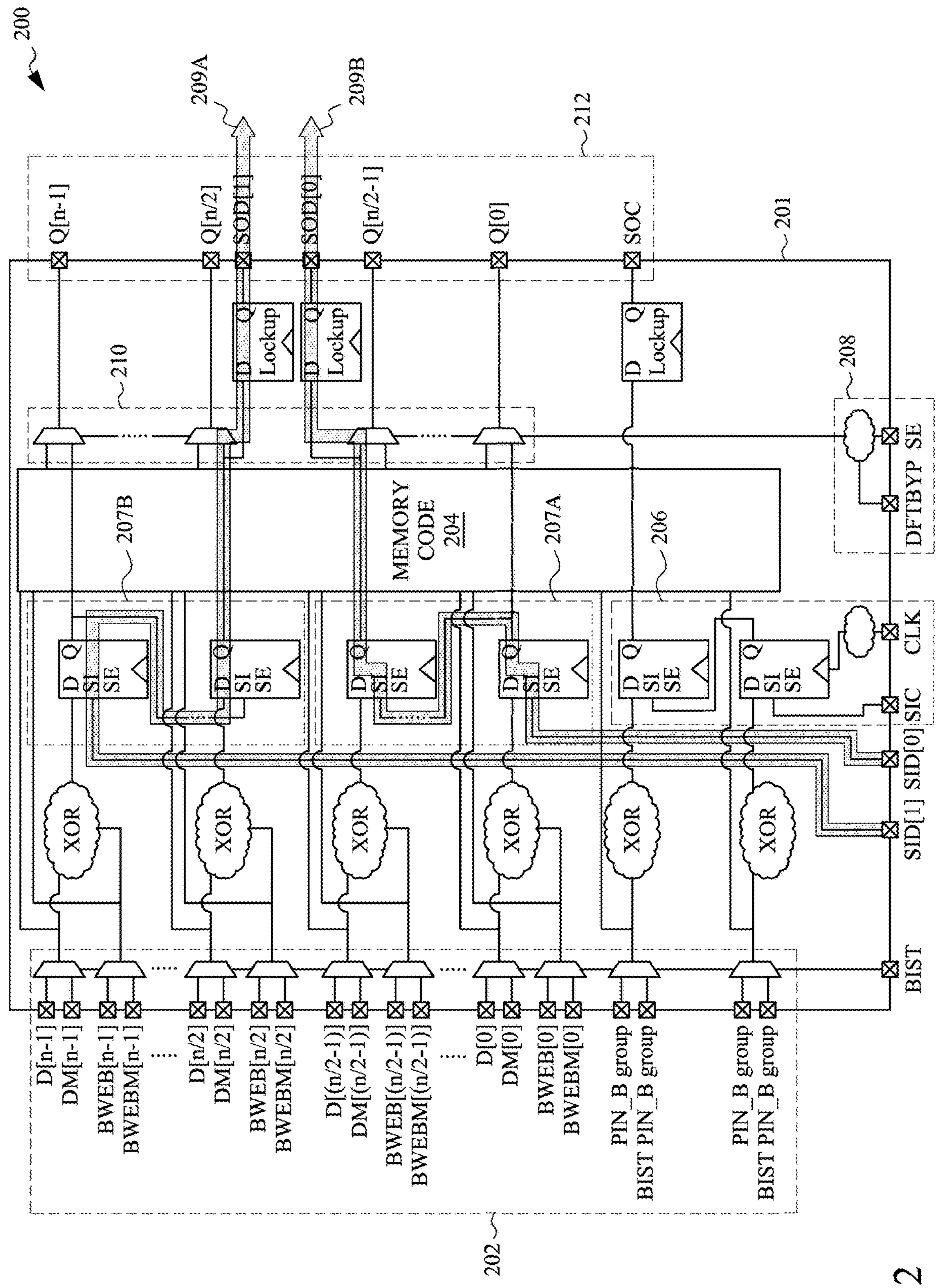
FIG. 2 illustrates a diagram of an example memory device implementing an internal scan chain, in accordance with some embodiments.

Referring to FIG. 2, illustrated is a diagram 200 of an example memory device 201 implementing internal scan chains 207A and 207B, in accordance with some embodiments. The memory device 201 can be similar to and include any of the structure and functionality of the memory device 106 of FIG. 1. The memory device 201 can include a set of input ports, with one set of input ports corresponding to a BIST mode (e.g., preceded by "BIST" or followed by the character "M"). For example, the ports D[0] to D[n−1] correspond to data input, while the input ports DM[0] to DM[n−1] correspond to data input for regular operation and BIST mode (e.g., testing mode), respectively, for n memory cells of the memory core 204.

The ports BWEB[0] to BWEB[n−1] correspond to byte write enable bar (BWEB) (e.g., a write enable signal) for normal operation, while the ports BWEBM[0] to BWEBM[n−1] correspond to a testing write enable signal, respectively. The PIN_A group and PIN_B group signals for the memory device 201 can correspond to control signals for the memory device 201, while the BIST PIN_A group and the BIST PIN_B group can correspond to testing control signals for the memory device 201. While performing testing operations, a control circuit (e.g., the control circuit 102) can generate input signals for each of the testing input ports (e.g., DM, BWEBM, BIST PIN_A group, BIST PIN_B group, etc.), in addition to providing one or more test vectors through the scan chain(s) 207A, 207B, as described in further detail herein.

The memory device 201 includes a clock control circuit 206, which can receive a clock signal CLK, for normal operation, and a scan-in control (SIC) signal which can be a set of control signals provided during a testing mode by a control circuit. The memory device 102 includes scan-in data ports, which can receive data from one or more test vectors (e.g., test vectors 104) and propagate this data through the scan chain(s) 207A, 207B of the memory device 201. In this example, two SID signals SID[0] and SID[1] are present, which respectively correspond to the scan chains 207A and 207B (sometimes generally referred to as "scan chain(s) 207"), in this example. However, it should be understood that in some implementations, a memory device 201 can include a single scan chain or more than two scan chains 207.

The memory device 201 is shown as including a memory core 204. The memory core 204 can include a set of memory cells, which may include SRAM memory cells, DRAM memory cells, or any other type of memory cell. Each memory cell in the memory core 204 can store a bit of data, which can be provided via one of the output ports Q[0] to Q[n−1] during normal device operation. The memory cells of the memory core can receive input data for write operations via the D[0] to D[n−1] signals. Write operations can be performed in response to a corresponding write enable signal (e.g., one of BWEB[0] to BWEB[n−1], for each of the n memory cells of the memory core 204). During a testing operation, multiplexor circuits coupled to the input ports can provide the test signals DM[0] to DM[n−1] and BWEBM[0] to BWEBM[n−1] as input to the memory cells of the memory core 204 (e.g., based on the testing enable signal BIST, as shown).

The memory device 201 is shown as including the internal scan chains 207A and 207B. Although two internal scan chains 207A and 207B are shown in this example, it should be understood that any number of internal scan chains can be implemented in a memory device 201. The scan chains 207B can each include sequences of interconnected flip-flops, with the output of each flip-flop being provided as input to the next flip-flop in the sequence. As shown, each of the scan chains 207A and 207B receive an input signal from the scan-in data ports SID[0] and SID[1]. As shown, in this example, each of the flip-flops in the scan chains 207 include input ports D, SI, and SE. The D input port can be a standard data input for the flip-flop in normal operational mode. The Scan-In (SI) port can be used to input test data into the flip-flop during scan chain testing. The Scan Enable (SE) port can be used to control whether the flip-flop operates in normal mode or scan mode. In scan mode, the flip-flop is configured to shift data serially through the chain. The SI port receives the data that is to be shifted into the flip-flop from the previous flip-flop in the scan chain. The flip-flops include an output port Q, which provides data as output.

As shown, when the scan enable signal is active, scan input data (e.g., test vectors) on the SID[0] and SID[1] ports are propagated through the scan chains 207A, 207B which propagate scan output ports SOD[0] and SOD[1] of the output ports 212 along data paths 209A and 209B, respectively. In some implementations, a lookup latch (as shown here) can be used to verify that the data passing through the scan chains 207A, 207B matches expected output. In such implementations, the lookup latches can store an expected output that is addressable by providing a corresponding test vector sequence (e.g., by shifting through the scan chain registers) to the lookup latch. If the input matches the expected values, the lookup latch can provide an output indication via the SOD[0] or SOD[1] ports, as shown. In some implementations, a lookup latch may not be used, and the comparison functionality may be implemented by a control circuit (e.g., the control circuit 102).

In some implementations, the clock control circuit 206 can switch the clock signal provided to the flip-flops in the scan chain 207 based whether the memory device 201 is in a scan mode (e.g., a test mode) or in a regular operation mode. For example, the control circuit may vary the clock signal CLK according to different test operations. The memory device 201 is shown as including output multiplexors 210, which switch between providing the output data of each flip-flop in the scan chains 207 as output at the output ports Q[0] to Q[n−1] and the output of the memory core 204 as output at the output ports Q[0] to Q[n−1]. The output multiplexors 210 may be switched by an output switching circuit 208, which may use logic to switch the multiplexor signals based on a scan enable signal SE and/or a testing bypass signal (DFTBYP). For example, if the scan enable signal SE or DFTBYP are active, the multiplexors 210 can provide the output of the flip-flops of the scan chains 207A, 207B, to the output ports Q[0] to Q[n−1].

The memory device 201 is shown as including a set of output ports 212. The output ports can include the output data ports Q[0] to Q[n−1]. The output ports 212 can include a shift output control (SOC) signal port. The signals for the SOC port can be provided via the clock control circuit 206, which is shown as including a sequence of two flip-flops (e.g., corresponding to the two sets of memory cells A (e.g., cell 0 to cell n/2-1) and B (e.g., cell n/2 to cell n−1), etc.) that receive and propagate the SIC signal. In some implementations, the output of the flip-flop chain of the clock control circuit 206 can be provided to a corresponding lookup latch, which may perform similar pattern matching described herein and generate an indication of whether the SIC control inputs properly propagated through the flip-flops of the clock control circuit 206.

As described herein, a control circuit (e.g., the control circuit 102) can provide any of the input signals described in connection with FIG. 2 to perform various testing operations. This may include shifting in data via the SID input ports, modifying clock and/or supply voltage signals to measure timing and/or Vmin, respectively, as well as providing test-specific control signals to configure the scan chains 207 to perform various operations described herein. As the test vectors are propagated through the memory device 201, the control circuit can measure/access output signals as they appear on the output ports 212 and compare the output signals to expected values.

If the output signals match expected values, the memory device 201 may be considered to pass a given test. If the output signals do not match expected values, the memory device 201 may be considered faulty and/or to have failed a given test. The supply voltage provided when a memory device 201 begins to fail can be indicative of the Vmin of the memory device. In some implementations, data provided on the output ports Q[0] to Q[n−1] may be propagated to the input data ports D[0] to D[n−1], such that data propagated via the scan chains 207A and 207B can be written to the memory cells of the memory core 204. In such implementations, data written to the scan chains can be propagated through the memory core 204 to evaluate the performance (e.g., Vmin, timing, etc.) of the memory cells of the memory core 204.

Figure 3:
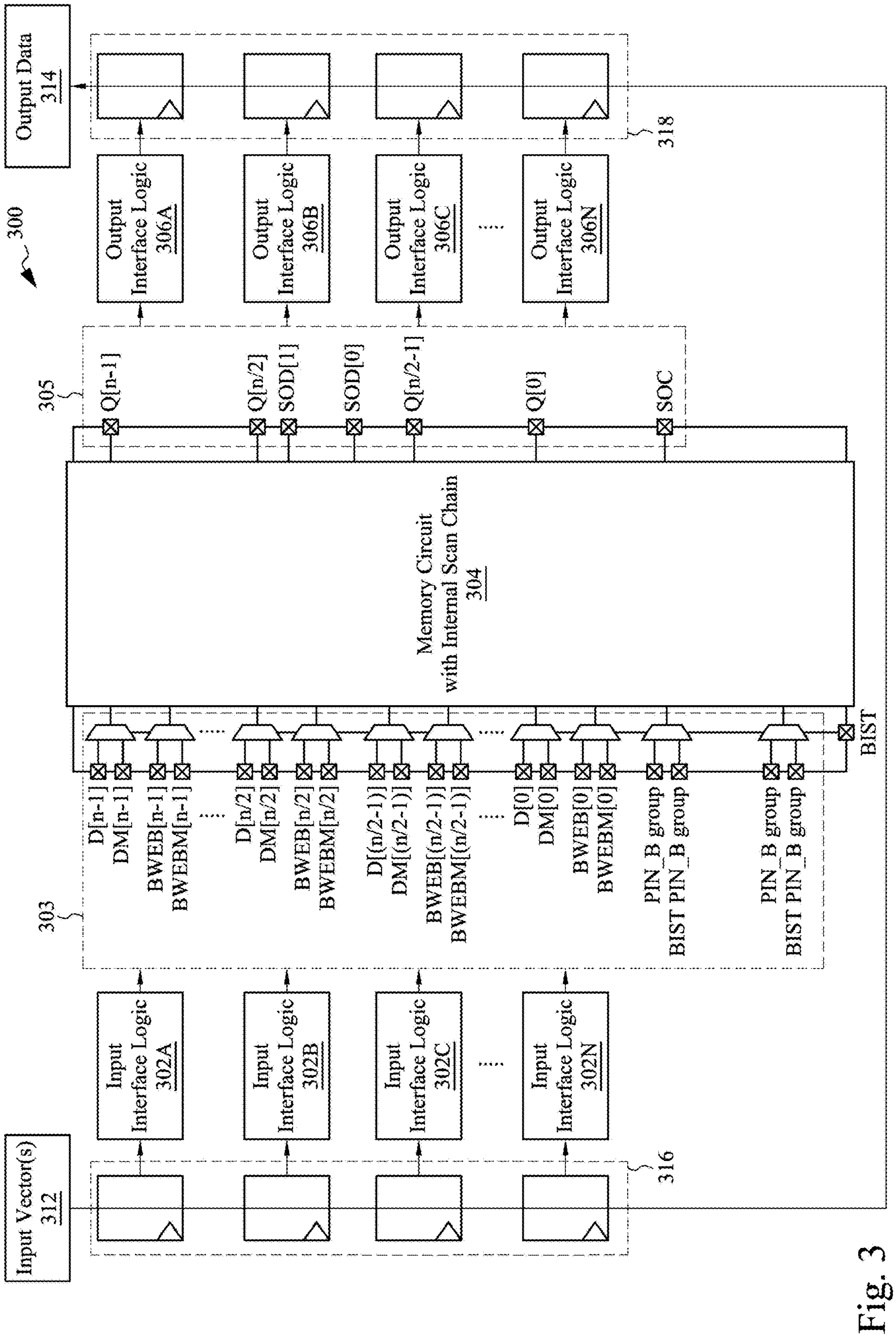
FIG. 3 illustrates a diagram of an example memory device implementing an interface scan chain that is separate from an internal scan chain of the memory device, in accordance with some embodiments.

Referring to FIG. 3, illustrated is a diagram of an example memory device 300 implementing an interface scan chain that is separate from an internal scan chain of the memory device, in accordance with some embodiments. The memory device 300 may be or include any of the structure or functionality of a memory device 106 of FIG. 1. The memory device 300 is shown as including a memory circuit 304 that includes an internal scan chain. The memory circuit 304 can be similar to, and include any of the structure and functionality of the memory device 201 of FIG. 2. For example, the memory circuit 304 can include a memory core (e.g., a memory core 204), internal scan chain(s) (e.g., one or more internal scan chains 207), and corresponding multiplexors (e.g., output multiplexors 210) or other logic to initialize the internal scan chain(s).

Similar to the memory device 201 of FIG. 2, the memory circuit 304 can include or otherwise receive data via one or more input ports 303 and provide data via one or more output ports 305. In this example, the input ports 303 and the output ports can be similar to and include any of the structure or functionality as the input ports 202 and the output ports 212 of FIG. 2. In some implementations, the input ports 303 can include a clock input port (e.g., the CLK port of FIG. 2), scan-in data ports (e.g., the SID[0] and SID[1] ports of FIG. 2), scan-in control ports (e.g., the SIC port of FIG. 2), or testing specific ports such as scan enable ports and/or testing bypass ports (e.g., the SE port, the DFTBYP port of FIG. 2, etc.).

In this example, each of the input ports are shown as being coupled to corresponding input interface logic 302A-302N (sometimes generally referred to as "input interface logic 302"). The input interface logic 302 can include registers/flip-flops, logic gates, transistors, or other components that can propagate signals from the flip-flops making up the input registers 316 of the interface scan chain into appropriate control and data signals that are compatible with the architecture of the memory circuit 304. The input interface logic 302 may include input buffers, address decoders, or data multiplexers, among other components. In some implementations, the input interface logic 302 may include timing-related components that are facilitate enforcing the setup and hold time parameters of the input ports 303 of the memory circuit 304. Such timing components may include delay circuits, synchronization circuits, or additional flip-flops or latches that facilitate data input from the input registers 316 of the interface scan chain and the corresponding input ports 303 of the memory circuit 304.

The memory circuit 304 can include or otherwise provide output data via one or more input ports 303, which may be similar to the output ports 212 of the memory device 201 of FIG. 2. In this example, each of the output ports 305 are shown as being coupled to corresponding output interface logic 306A-306N (sometimes generally referred to as "output interface logic 306"). The output interface logic 306 can include registers/flip-flops, logic gates, transistors, or other components that can propagate signals from the output ports 305 to the output registers 318 of the interface scan chain into appropriate output signals that are compatible external components coupled to the memory circuit 304, such as a control circuit (e.g., the control circuit 102) for evaluating testing outputs of the memory circuit 304 and/or the interface scan chain (e.g., the input registers 316 and/or the output registers 318 of the interface scan chain). The output interface logic 306 may include input buffers, address decoders, or data multiplexers, among other components. In some implementations, the output interface logic 306 may include timing-related components that are facilitate enforcing the setup and hold time parameters of the output ports 305 of the memory circuit 304.

The interface scan chain of the memory device 300 is shown as including a chain of input registers 316 connected to a chain of output registers 318. The line through each of the input registers 316 and the output registers 318 indicates the flow of data through the interface scan chain. The data shifted through the scan chain may include one or more input vectors 312, which may include any of the structure and/or functionality of the test vectors 104 of FIG. 1. Similar to the operation of the internal scan chain 207 of FIG. 2, the interface scan chain can receive an input vector 312 in sequence and propagate the input vector 312 through each of the input registers 316 and the output registers 318 of the scan chain, as shown.

In some implementations, data in each input register 316 may be propagated through each corresponding input interface logic 302 in order to test various operational characteristics of the input interface logic 302, the memory circuit 304, the input ports 303, the output ports 305, and/or the output interface logic 306. Propagating an input vector through the input registers 316 and the output registers 318 can verify that the input registers 316 and the output registers 318 operate under normal operating conditions. Additional tests may be performed (e.g., coordinated/configured by a control circuit such as the control circuit 102) to evaluate timing characteristics of the input registers 316, the output registers 318, the input interface logic 302, and/or the output interface logic 306.

Any suitable testing/verification process can be used to test the functionality (e.g., whether the device operates correctly under normal conditions, Vmin data, etc.) and/or timing characteristics (e.g., setup and hold time under various timing conditions, etc.) of the memory device 300. The output data 314 produced by the output registers 318 of the interface scan chain can be compared to expected data for a corresponding test vector 312 to verify whether any aspect of the memory device 300 is operating incorrectly. Although shown here as being provided by only a single output register 318, it should be understood that in some implementations the output data 314 may be provided by more than one output register 318 (e.g., in parallel, etc.), for example, subsequent to one or more memory operations executed via a test vector 312. In some implementations, data in the output registers 318 may be shifted out of the output registers 318 for a subsequent comparison with expected data (e.g., via a lookup latch, via the control circuit, etc.).

In this example, the internal scan chain of the memory circuit 304 and the interface scan chain are separated. As such, in some implementations, the interface scan chain may receive a first test vector 312 and the internal scan chain (e.g., the internal scan chain 207) may receive one or more additional test vectors separately or in parallel with testing of the interface scan chain. Separating the scan chains provides additional testing coverage when compared to group-based testing approaches. Like the approaches described in connection with FIG. 2, the interface scan chain can be controlled/configured via corresponding configuration signals provided via a control circuit. The internal scan chain can be controlled/configured on a per-memory device basis, such that each memory device in a memory system can be evaluated separately, rather than in groups, as described in connection with FIG. 1.

Figure 4:
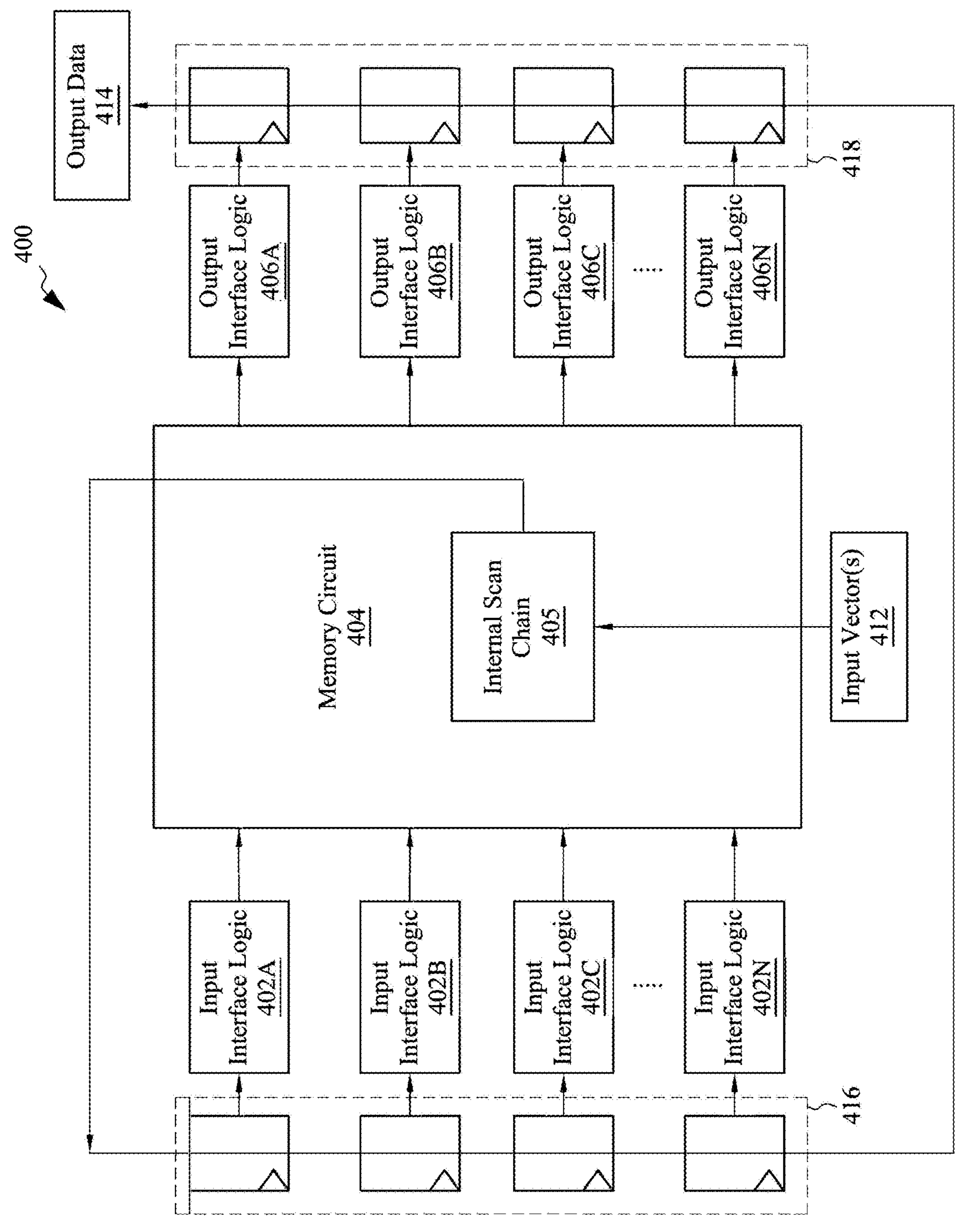
FIG. 4 illustrates a diagram of an example memory device implementing an interface scan chain that is coupled to an internal scan chain of the memory device, in accordance with some embodiments.

FIG. 4 illustrates a diagram of an example memory device 400 implementing an interface scan chain (e.g., including input registers 416 and output registers 418) that is coupled to an internal scan chain 405 of a memory circuit 404, in accordance with some embodiments. The memory device 400 may be or include any of the structure or functionality of a memory device 106 of FIG. 1. The memory device 400 is shown as including a memory circuit 404 that includes at least one internal scan chain 405. The internal scan chain(s) 405 can be similar to and include any of the structure and/or functionality of the scan chain(s) 207. The memory circuit 404 can be similar to, and include any of the structure and functionality of the memory device 201 of FIG. 2 or the memory circuit 304 of FIG. 3. For example, the memory circuit 404 can include a memory core (e.g., a memory core 204) and corresponding multiplexors (e.g., output multiplexors 210) or other logic to initialize the internal scan chain(s) 405.

Similar to the memory device 201 of FIG. 2, the memory circuit 404 can include or otherwise receive data via one or more input ports (e.g., similar to the input ports 303 of FIG. 3, not shown here for visual clarity) and provide data via one or more output ports (e.g., similar to the output ports 305 of FIG. 3, not shown here for visual clarity). Similar to the arrangement of FIG. 3, the input ports of the memory circuit 404 can be coupled to corresponding input interface logic 402A-402N (sometimes generically referred to as "input interface logic 402"). The input interface logic 402 can include any of the structure and functionality of the input interface logic 302 of FIG. 3. The output ports of the memory circuit 404 can be coupled to corresponding output interface logic 406A-406N (sometimes generically referred to as "output interface logic 406"). The output interface logic 406 can include any of the structure and functionality of the output interface logic 306 of FIG. 3.

The interface scan chain of the memory device 400 is shown as including a chain of input registers 416 connected to a chain of output registers 418. Similar to the arrangement of FIG. 3, the line through each of the input registers 416 and the output registers 418 indicates the flow of data through the interface scan chain. In this arrangement, rather than being separate from the interface scan chain, the internal scan chain 405 is shown as receiving input vector 412 (e.g., a test vector 104) and providing an output to the input of the input registers 416 of the interface scan chain. Data shifted through the internal scan chain 405 may therefore also propagate through each register in the interface scan chain, depending on the configuration of the input vector(s) 412 and control signals provided by the control circuit (e.g., control circuit 102).

In some implementations, data in each input register 416 may be propagated through each corresponding input interface logic 402 in order to test various operational characteristics of the input interface logic 402, the memory circuit 404, and/or output interface logic 406. Propagating an input vector through the input registers 416 and the output registers 418 can verify that the input registers 416 and the output registers 418 operate under normal operating conditions. Additional tests may be performed (e.g., coordinated/configured by a control circuit such as the control circuit 102) to evaluate timing characteristics of the input registers 416, the output registers 418, the input interface logic 402, and/or the output interface logic 406.

Any suitable testing/verification process can be used to test the functionality (e.g., whether the device operates correctly under normal conditions, Vmin data, etc.) and/or timing characteristics (e.g., setup and hold time under various timing conditions, etc.) of the memory device 400. The output data produced by the output registers 418 of the interface scan chain can be compared to expected data for a corresponding test vector 412 to verify whether any aspect of the memory device 400 is operating incorrectly. Although shown here as being provided by only a single output register 418, it should be understood that in some implementations the output data may be provided by more than one output register (e.g., in parallel, etc.), for example, subsequent to one or more memory operations executed via a test vector 412. In some implementations, data in the output registers 418 may be shifted out of the output registers 418 for a subsequent comparison with expected data (e.g., via a lookup latch, via the control circuit, etc.).

In this arrangement, the test vector 412 can be configured to include data to evaluate the performance of both the internal scan chain 405 and the interface scan chain together in a single testing operation. In doing so, the control circuit (e.g., control circuit 102) can propagate corresponding control signals to ensure that the scan input data (e.g., input vectors 412) and the output data 414 are properly provided and captured for verification. This may include transmitting scan enable signals, bypass signals, and/or other control signals to perform a requested test operation. in some implementations, testing the operational characteristics of the memory device 400 may include modifying the supply voltage, clock frequency, or timing between signals to ensure that threshold Vmin and setup/hold time constraints are satisfied for the memory device. As in the arrangement shown in FIG. 1, the techniques described herein can be used to evaluate each memory device 400 individually, rather than in groups, enabling precise verification of the characteristics of individual memory devices.

Figure 5:
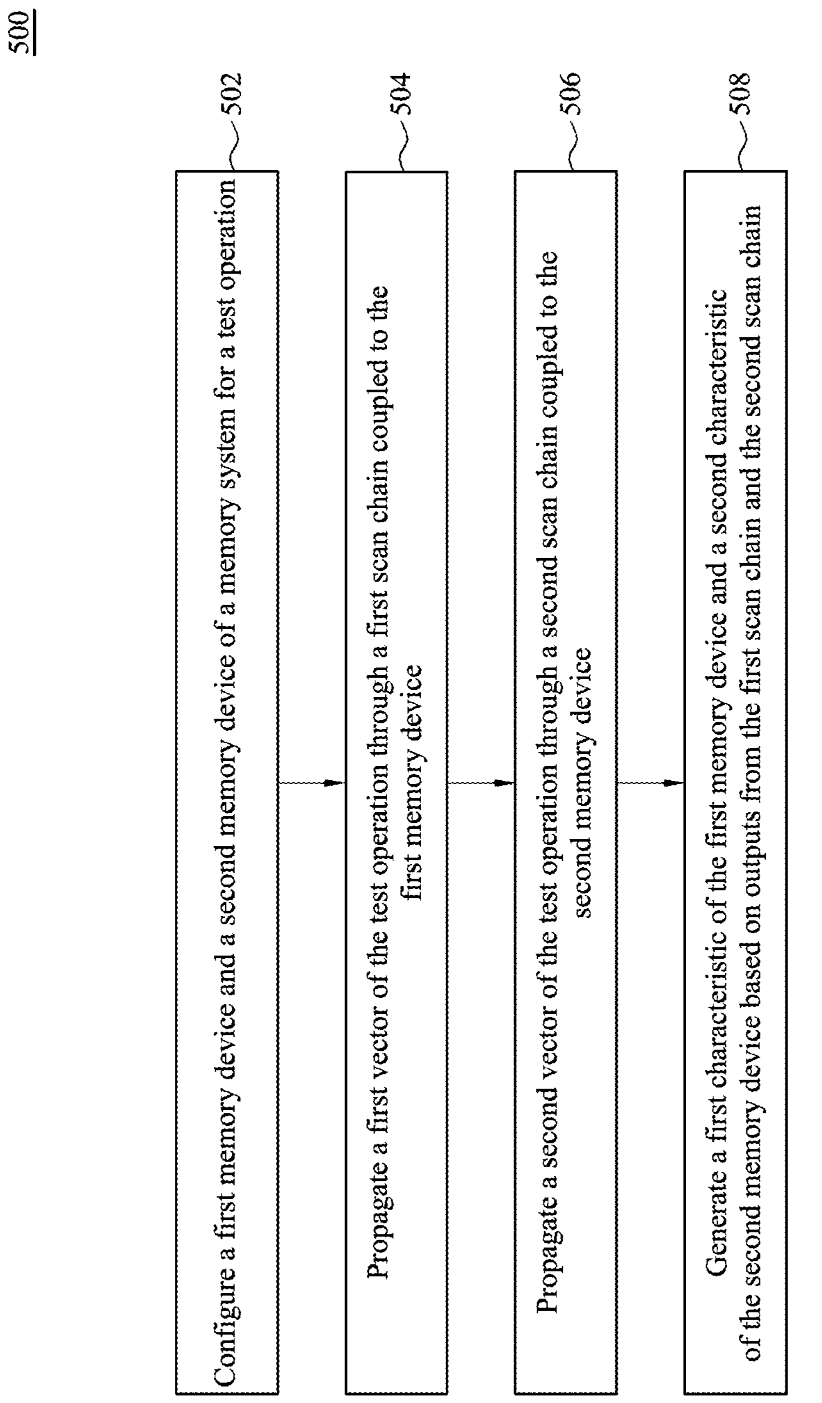
FIG. 5 illustrates a flowchart of example method of operating an example memory test circuit that implements memory device-specific scan chains, in accordance with some embodiments.

FIG. 5 illustrates a flowchart of example method 500 of operating an example memory test circuit that implements memory device-specific scan chains, in accordance with some embodiments. The method 500 may be used to operate a memory circuit (e.g., the memory test system 100, the memory devices 201, 300, 400, etc.). It is noted that the method 500 is merely an example and is not intended to limit the present disclosure. Accordingly, it is understood that additional operations may be provided before, during, and after the method 500 of FIG. 5, and that some other operations may only be briefly described herein.

In brief overview, the method 500 starts with operation 502 of configuring a first memory device and a second memory device of a memory system for a test operation. The method 500 proceeds to operation 504 of propagating a first vector of the test operation through a first scan chain coupled to the first memory device. The method 500 proceeds to operation 506 of propagating a second vector of the test operation through a second scan chain coupled to the second memory device. The method 500 proceeds to operation 508 of generating a first characteristic of the first memory device and a second characteristic of the second memory device based on outputs from the first scan chain and the second scan chain.

Referring to operation 502, a first memory device (e.g., memory device 106A) and a second memory device (e.g., memory device 106B) can be configured for a test operation. The first and second memory devices may include any suitable type of memory device including a device-specific scan chain, including an internal scan chain (e.g., internal scan chain 207, internal scan chain 405) and/or an interface scan chain (e.g., as shown in FIGS. 3 and 4). The configuration may be performed via a control circuit (e.g., the control circuit 102). Configuring the first and second memory devices may include providing corresponding configuration signals (e.g., scan enable signals, etc.) to initialize the components (e.g., flip-flops, multiplexors, etc.) of the memory devices for a corresponding test operation. In some implementations, configuring the first memory device and the second memory device may include accessing/loading corresponding test vectors (e.g., test vectors 104A, 104B) to perform the test operation on the memory devices.

Referring to operation 504, a second vector (e.g., the test vector 104A) of the test operation is propagated through a first scan chain (e.g., the scan chain(s) 207, the interface scan chains of FIG. 3 or 4, etc.) coupled to the first memory device. Propagating the first test vector through the first scan chain may include sequentially providing each bit/data signal to the first register(s) of the first scan chain. With each clock cycle, the next bit/data signal in the first register(s) can be propagated to the next register(s) in the first scan chain, while the next bit/data signal(s) are provided to the first register(s) of the first scan chain. This process is repeated until all data in the first test vector is propagated through each register in the scan chain.

In some implementations, signals propagated through the registers of the scan chain may be provided to one or more components (e.g., the memory core, etc.) of the first memory device. Signals propagated through the memory device can be verified by the control circuit to verify various characteristics of the memory device, for example, in step 508. In some implementations, in addition to providing the test vector(s) through the scan chain, the control circuit may alter one or more control or power signals of the first memory device. For example, the control circuit may progressively decrease the voltage supplied to the memory device while monitoring its operation (e.g., each shift of the test vector). As the voltage drops below a certain threshold, the output signals from the memory device may become unreliable or deviate significantly from the expected values, which can be detected during step 508 to determine characteristics of the memory device.

Referring to operation 506, a second vector (e.g., the test vector 104B) of the test operation can be propagated through a second scan chain (e.g., the scan chain(s) 207, the interface scan chains of FIG. 3 or 4, etc.) coupled to the second memory device (e.g., the memory device 106B). Propagating the second test vector through the second scan chain may include performing similar operations described in step 504 with respect to sequentially providing each bit/data signal to the second register(s) of the second scan chain. Signals propagated through the registers of the second scan chain can be provided to one or more components (e.g., the memory core, etc.) of the second memory device. Signals propagated through the second memory device can be verified by the control circuit to verify various characteristics of the second memory device, for example, in step 508.

As described herein, the first scan chain and the second scan chain can be device-specific scan chains, which are not connected to one another. As such, the first test vector and the second test vector can be propagated through the first memory device and the second memory device separately or in parallel by one or more control circuits to independently verify the operational characteristics of the first and second memory devices. This enables improved precision and test coverage compared to group-based approaches, in which a single scan chain/test vector is used to verify the characteristics of groups of memory devices. In some implementations, the control circuit can provide signals to deactivate the scan chain of the first memory device while propagating the second vector through the second scan chain of the second memory device. For example, the control circuit can deactivate the scan enable signal of the first memory device while propagating the second vector though the second scan chain, such that the first memory device and second memory device are tested sequentially.

Referring to operation 508, a first characteristic (e.g., Vmin, setup/hold characteristics, device functionality) of the first memory device and a second characteristic (e.g., Vmin, setup/hold characteristics, device functionality) of the second memory device are generated based on outputs (e.g., output signals SOC, SOD, output data 314, output data 414, etc.) from the first scan chain and the second scan chain. To determine the minimum voltage requirement (referred to herein as Vmin), the control circuit can progressively reduce the supply voltage to both memory devices while simultaneously propagating the test vector through their respective scan chains. The output signals from each memory device are monitored for any deviations from expected values as the voltage decreases. The Vmin is identified as the lowest voltage at which all outputs remain stable and consistent with the expected response to the first and second test vectors.

For evaluating setup/hold time characteristics, specific timing patterns are incorporated within the first test vector. These patterns involve varying the arrival times of data signals relative to the clock edge of the memory device. This may also include modifying the input clock frequency and/or duty cycle while propagating the test vector through the scan chains. In some implementations, the control circuit can adjust the timing providing the first and second test vector while monitoring the output signals from each memory device. By analyzing the outputs for errors or inconsistencies at different input signal delays, the setup and hold time parameters can be precisely determined. The setup time represents the minimum duration that a valid data signal needs to be present before the rising edge of the clock, while the hold time specifies the minimum duration that a valid data signal needs to remain stable after the falling edge of the clock. The first and second test vectors may also be used to verify that the memory device components and/or flip-flops of the scan chains are operating under normal operating conditions using similar techniques.

As described herein, the first scan chain and the second scan chain can be device-specific scan chains, which are not connected to one another. As such, the one or more control circuits can verify the operational characteristics of the first and second memory devices independently, rather than in a group. This enables improved precision and test coverage compared to group-based approaches, in which a single scan chain/test vector is used to verify the characteristics of groups of memory devices.

In one aspect of the present disclosure, a system is disclosed. The system includes a first memory device comprising a first memory element, a first input port, and a first internal scan chain coupled between the first memory element and the first input port. The system includes second memory device comprising a second memory element, a second input port, and a second internal scan chain coupled between the second memory element and the second input port. The system includes a control circuit configured to propagate a first test vector through the first internal scan chain and a second test vector through the second internal scan chain.

In another aspect of the present disclosure, a memory device is disclosed. The memory device includes a memory element, an input port, and an output port. The memory device includes an internal scan chain coupled between the input port and the memory element. The memory device includes an interface scan chain coupled to the input port and the output port.

In yet another aspect of the present disclosure, a method is disclosed. The method includes configuring, by a control circuit, a first memory device and a second memory device of a memory system for a test operation. The method includes propagating, by the control circuit, a first vector of the test operation through a first scan chain coupled to the first memory device. The method includes propagating, by the control circuit, a second vector of the test operation through a second scan chain coupled to the second memory device. The method includes generating, by the control circuit, a first characteristic of the first memory device and a second characteristic of the second memory device based on outputs from the first scan chain and the second scan chain.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:

a first memory device comprising:

a first memory element, a first input port, and a first internal scan chain coupled between the first memory element and the first input port;

a second memory device comprising:

a second memory element, a second input port, and a second internal scan chain coupled between the second memory element and the second input port; and a control circuit configured to propagate a first test vector through the first internal scan chain and a second test vector through the second internal scan chain, wherein the first test vector is different than the second test vector and is generated based on a memory architecture of the first memory device.

2. The system of claim 1, wherein the control circuit is further configured to propagate the first test vector and the second test vector through the first internal scan chain and the second internal scan chain in parallel.

3. The system of claim 1, wherein the control circuit is further configured to verify a first characteristic of the first memory device and a second characteristic of the second memory device responsive to propagating the first test vector and the second test vector through the first internal scan chain and the second internal scan chain.

4. The system of claim 3, wherein the first characteristic and the second characteristic comprise one or more of a minimum voltage (Vmin), a setup time, or a hold time.

5. The system of claim 1, wherein the first memory device further comprises:

a first interface scan chain; and a first set of interface logic coupled between the first input port and the first interface scan chain.

6. The system of claim 5, wherein an output of the first internal scan chain is coupled to an input of the first interface scan chain.

7. The system of claim 5, wherein the control circuit is further configured to propagate third test vector through the first interface scan chain.

8. The system of claim 7, wherein the control circuit is further configured to verify a third characteristic of the first memory device.

9. The system of claim 8, wherein the third characteristic comprises at least one of a setup time or hold time associated with at least one of the first input port or a first output port of the first memory device.

10. The system of claim 1, wherein the control circuit is configured to deactivate the first internal scan chain of the first memory device while propagating the second test vector through the second internal scan chain of the second memory device.

11. The system of claim 1, wherein the first memory device further comprises an output port, and wherein the control circuit is further configured to propagate the first test vector through the first internal scan chain and receive an output via the output port.

12. A memory device, comprising:

a memory element, an input port, and an output port;

an internal scan chain coupled between the input port and the memory element; and an interface scan chain coupled to the input port and the output port;

wherein the internal scan chain is configured to receive a first test vector that is generated based on a memory architecture of the memory device.

13. The memory device of claim 12, wherein the memory device further comprises input logic coupled between the interface scan chain and the input port.

14. The memory device of claim 12, wherein the memory device further comprises output logic coupled between the interface scan chain and the output port.

15. The memory device of claim 12, wherein an output register of the internal scan chain is coupled to an input register of the interface scan chain.

16. The memory device of claim 12, wherein:

the internal scan chain is configured to receive a first test vector from a control circuit, and the interface scan chain is configured to receive a second test vector from the control circuit.

17. The memory device of claim 12, wherein the input port of the memory device is configured to select between a first set of input signals and a second set of test signals based on a test enable signal.

18. A method, comprising:

configuring, by a control circuit, a first memory device and a second memory device of a memory system for a test operation;

propagating, by the control circuit, a first vector of the test operation through a first scan chain coupled to the first memory device;

propagating, by the control circuit, a second vector of the test operation through a second scan chain coupled to the second memory device, wherein the first vector is generated based on the first memory device and the second vector is generated based on the second memory device; and generating, by the control circuit, a first characteristic of the first memory device and a second characteristic of the second memory device based on outputs from the first scan chain and the second scan chain.

19. The method of claim 18, wherein the first scan chain comprises a first internal scan chain of the first memory device and the second scan chain comprises a second internal scan chain of the second memory device.

20. The method of claim 18, wherein the first characteristic and the second characteristic comprise one or more of a minimum voltage (Vmin), a setup time, or a hold time.

* * * * *